(12) United States Patent
Scholtens (10) Patent No.: US 7,277,041 B2
(45) Date of Patent: Oct. 2, 2007

(54) CROSS-COUPLED FOLDING CIRCUIT AND ANALOG-TO-DIGITAL CONVERTER PROVIDED WITH SUCH A FOLDING CIRCUIT

(75) Inventor: Peter Cornelis Simeon Scholtens, Eindhoven (NL)

(73) Assignee: NXP B.V., Eindhoven (NL)

(*) Notice: Subject to any disclaimer, the term of this patent is extended or adjusted under 35 U.S.C. 154(b) by 118 days.

(21) Appl. No.: 10/566,551

(22) PCT Filed: Jul. 26, 2004

(86) PCT No.: PCT/IB2004/051289

§ 371 (c)(1),
(2), (4) Date: Jan. 27, 2006

(87) PCT Pub. No.: WO2005/011125

PCT Pub. Date: Feb. 3, 2005

(65) Prior Publication Data

US 2007/0090978 A1 Apr. 26, 2007

(30) Foreign Application Priority Data

Jul. 30, 2003 (EP) .................................. 03102364

(51) Int. Cl.
*H03M 1/36* (2006.01)
(52) U.S. Cl. ...................... 341/159; 341/155; 341/156; 341/158
(58) Field of Classification Search ................ 341/156, 341/159
See application file for complete search history.

(56) References Cited

U.S. PATENT DOCUMENTS

| | | | | |
|---|---|---|---|---|
| 5,307,067 A * | 4/1994 | Kimura et al. | ............... | 341/159 |
| 5,309,157 A * | 5/1994 | Yee | ................ | 341/156 |
| 5,376,937 A * | 12/1994 | Colleran et al. | ............ | 341/159 |
| 5,392,045 A * | 2/1995 | Yee | ................ | 341/156 |
| 5,835,047 A * | 11/1998 | Vorenkamp et al. | ........ | 341/156 |
| 6,236,348 B1 | 5/2001 | Bore et al. | | |
| 6,285,308 B1 * | 9/2001 | Thies et al. | ................. | 341/155 |
| 6,411,246 B2 * | 6/2002 | Nagaraj | ....................... | 341/158 |
| 6,570,522 B1 * | 5/2003 | Galambos et al. | .......... | 341/155 |
| 6,950,051 B2 * | 9/2005 | Lee et al. | .................... | 341/156 |
| 2005/0083223 A1 * | 4/2005 | Devendorf | .................. | 341/156 |

\* cited by examiner

*Primary Examiner*—Khai M. Nguyen
(74) *Attorney, Agent, or Firm*—Peter Zawilski (57) ABSTRACT

A cross coupled folding circuit comprises a reference voltage circuit to supply m reference voltages, an amplifier circuit to provide control signals, in response to an input signal and to the reference voltages and $2^n - I$ three times cross coupled folding circuits, each of which comprising three differential transistor pairs, said differential transistors pairs being controlled by said control signals and active in a voltage range around a respective one of said reference voltages, with $m=3(2^n-1)$. In cascade with said $2^n - I$ folding circuits, there are differential transistor pairs in n−1 successive steps $2^{n-1}, 2^{n-2}, 2^0$. To obtain complete folding, switching circuits are provided, cooperating with the transistor pairs in the last $_2$n−2 steps of the cascade configuration, to supply the respective control signals to those transistors of the respective differential transistor pairs that provide complete folding.

7 Claims, 11 Drawing Sheets

CROSS-COUPLED FOLDING CIRCUIT AND ANALOG-TO-DIGITAL CONVERTER PROVIDED WITH SUCH A FOLDING CIRCUIT

This application is a 371 of PCI/IB04/51289 filed Jul. 26, 2004, which claims priority from European Patent application 03102364,1 filed Jul. 30, 2003.

The invention relates to a cross-coupled folding circuit, comprising a reference voltage circuit to supply a series of m reference voltages, an amplifier circuit to provide a series of control signals in response to an input signal and to the reference voltages, and a number of differential transistor palm in a cascade configuration controlled by said control signals, each differential pair of transistors being active in a voltage range around one of said reference voltages.

Such a cross-coupled folding circuit is known from U.S. Pat. No. 6,236,348. Particularly in FIG. 4 of said patent specification a three times folding circuit, i.e. a cascade configuration of successively two and one differential transistor pairs is shown, while in FIG. 9 a seven times folding circuit in a cascade configuration in three successive steps of four, two and one differential transistor pairs, is shown. The differential transistor pairs in the cross-coupled folding circuit of said U.S. patent specification are only controlled by signals, derived from an input signal and a series of reference voltages. A cascade configuration of cross coupled folding circuits, wherein each cross coupled folding circuit of a successive may of cross coupled folding circuits is controlled by output signals of a respective cross coupled folding circuit of a former array is not well possible; this contrary to, for example, a cascade configuration of parallel folding circuits.

The aim of the invention is to obtain a cross-coupled folding circuit in which this restriction is overcome and which has a limited quantity of hardware, a large folding factor and a low energy consumption.

Therefore, according to the invention, the cross-coupled folding circuit as described in the opening paragraph is characterized in that $2^n-1$ three times cross-coupled folding circuits are provided, each of which comprising three differential pairs of transistors, and, in a cascade configuration with said $2^{n-1}$ folding circuits, in n-1 successive steps $2^{n-1}$, $2^{n-2}$, ..., $2^0$ differential transistor pairs, the control signals thereof being supplied by the series of three times cross-coupled folding circuits, and $m=3(2^n-1)$, while, to obtain complete folding, switching circuits cooperating with the transistor pairs in the last $2^{n-2}$ steps of the cascade configuration are provided, to supply the respective control signals to those transistors of the respective differential transistor pairs that provide complete folding.

The invention further relates to an analog-to-digital converter provided with such a folding circuit.

The above and other objects and features of the present invention will become more apparent from the following detailed description considered in connection with the accompanying drawings, in which.

Figure 1:
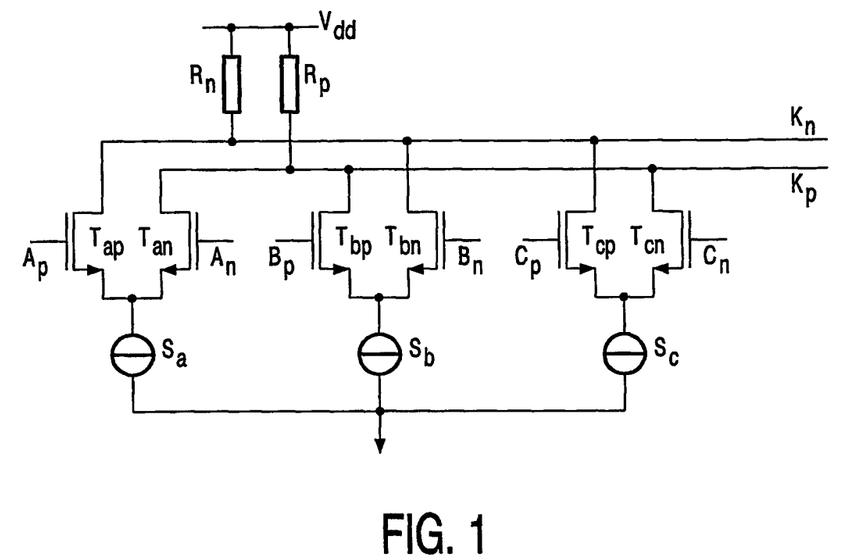
FIG. 1 shows a three times parallel folding circuit according to the state of the art.

The parallel folding circuit, illustrated in FIG. 1, is constituted by three pairs of transistors Tap, Tan; Tbp, Tbn; and Tcp, Tcn, each pair having a current source Sa, Sb, Sc, providing for a constant current $I_{tail}$, and resistors Rn and Rp connecting the transistors to a power supply Vdd. The resistors Rn and Rp form a resistive load $R_{load}$. Each of the current sources are supposed to provide for a constant current, while further Rn=Rp. Input signals Ap, Bp and Cp and inverted input signals An, Bn and Cn respectively are supplied to the bases of the pairs of transistors. These input signals are composed of an input signal Vin and reference signals Vref(a), Vref(b) and Vref(c), with 0<Vref(a)<Vref(b)<Vref(c). When the folding circuit is applied in an analog-to-digital converter, the input signal Vin is considered to be the signal to be converted. The base input signals are represented by Ap=Vref(a)−Vin, An=−Vref(a)+Vin; Bp=Vref(b)−Vin, Bn=−Vref(b)+Vin; Cp=Vref(c)−Vin; Cn=−Vref(c)+Vin. By means of these base input signals a number of different current routings may be obtained. When Vin=0, the transistors Tap, Tbp and Tcp are blocked and current routings via Tan, Tcn and Rp and a current routing via Tbn and Rn provide a "low" voltage on the output Kp, i.e. a voltage Vdd−$2I_{tail}$·$R_{load}$, and a "high" voltage on the output Kn, i.e. a voltage Vdd−$I_{tail}$·$R_{load}$. When the input signal Vin increases, this situation remains unaltered till Vin comes in a certain range around the reference value Vref(a). Then, an increasing current through Tap and a decreasing current through Tan is obtained till Tan is blocked and current routings via Tap, Tbn and Rn, and a current routing via Tcn and Rp provide said "low" voltage on the output Kn and for said "high" voltage on the output Kp, till Vin is further increased and comes in a range around the reference value Vref(b), which range is supposed to be equal and in succession to the above range around Vref(a), and an increasing current through Tbp and a decreasing current through Tbn is obtained till Tbn is blocked and a current routing via Tap and Rn and current routings via Tbp, Tcn and Rp provide said "high" voltage on the output Kn and said "low" voltage on the output Kp. When Vin is further increased and comes in a range around the reference value Vref(c), which range again is supposed to be equal and in succession to the above ranges, an increasing current through Tcp and a decreasing current through Tcn is obtained till Tcn is blocked and current routings via Tap, Tcp and Rn and a current routing via Tbp and Rp provide said "low" voltage on the output Kn and said "high" voltage on the output Kp.

Figure 2:
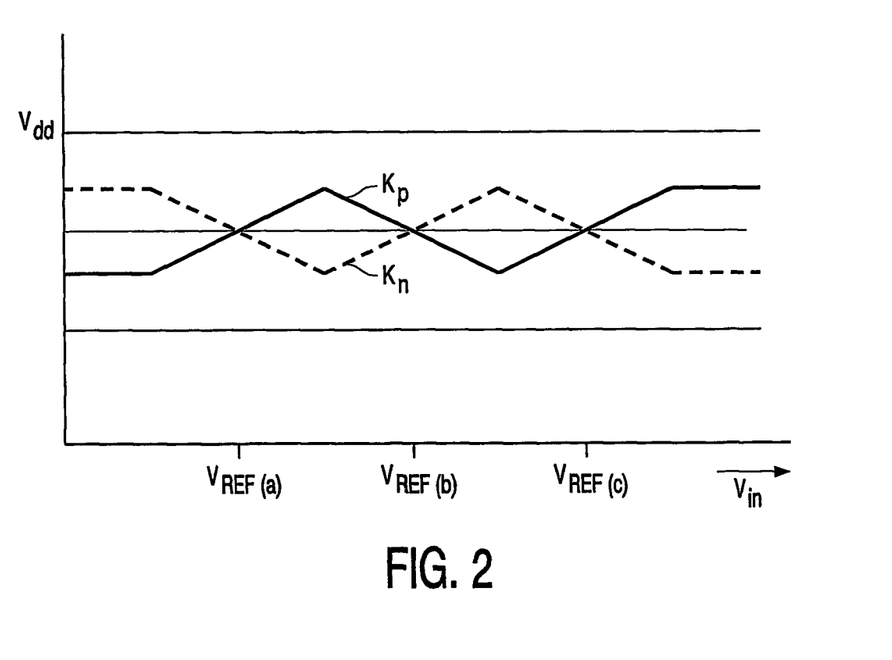
FIG. 2 shows a diagram illustrating the output voltages of the parallel folding circuit of FIG. 1.

In FIG. 2 shows the voltage values on the outputs Kp and Kn as a function of Vin. It can be seen that in the ranges around the reference voltages the voltages on the outputs Kp, Kn and Kp respectively provide a folding with a folding factor 3. The resulting output voltages of the folding cell have a common value of Vdd $-\frac{3}{2} \cdot I_{tail} \cdot R_{load}$ and a voltage swing of $I_{tail} \cdot R_{load}$.

The parallel folding cell does have some disadvantages. Particularly, when, in comparison with a single transistor pair, a number of parallel transistor pairs, in this example 3, are applied to obtain folding, the load resistance will be reduced by the folding factor, in this example by a factor of 3, while the tail currents will be the same. This means that the voltage swing and thus the amplification of the array of transistor pairs is reduced, in this example by a factor of 3, or, in other words, the amplification of the parallel folding circuit is dependent on the folding factor. As also the amplification of a pair of transistors is mostly chosen rather low to achieve a high bandwidth, the amplification of the total folding cell is strongly limited.

Figure 3:
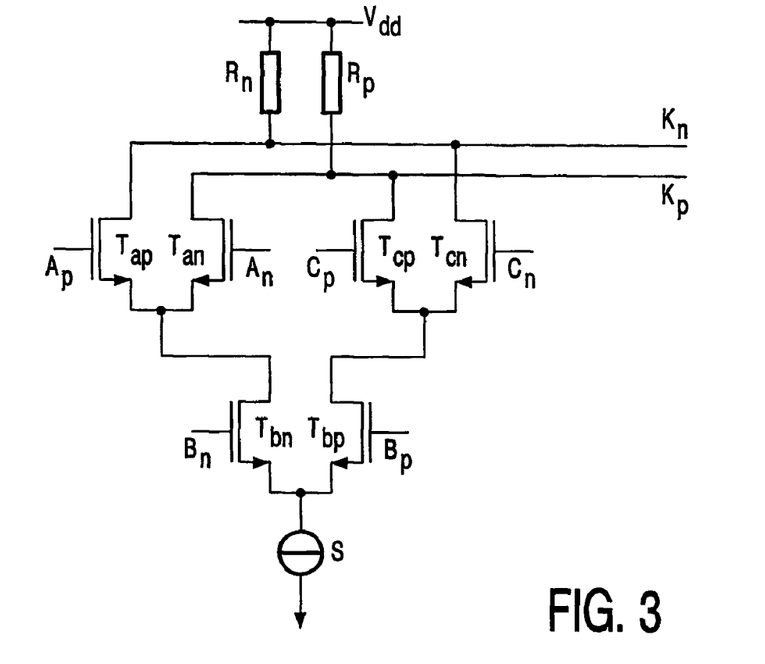
FIG. 3 shows a cross-coupled folding circuit according to the state of the art.

FIG. 3 shows a cross coupled folding circuit constituted by three pairs of transistors Tap, Tan; Tbp, Tbn; and Tcp, Tcn, a current source S and resistors Rn and Rp connecting the transistors to a power supply Vdd. Input signals Ap, Bp and Cp respectively and inverted input signals An, Bn and Cn are supplied to the bases of the pairs of transistors. In order to compare the cross coupled folding circuit with the above parallel folding circuit, these input signals are supposed to be identical to the input signals of the parallel folding circuit of FIG. 1. The resistor values are chosen about three times the values of the resistors in the circuit of FIG. 1, while the single power source is the same as each of the power sources in FIG. 1. When Vin=0, the transistors Tap, Tbp and Tcp are blocked and a current routing via Tbn, Tan and Rp provides a "low" voltage on the output Kp, i.e. a voltage with the value Vdd–$I_{tail} \cdot R_{load}$, while the voltage on the output Kn is "high", i.e. practically Vdd. When the input signal Vin increases, this situation remains unaltered till Vin comes in the range around the reference value Vref(a). Then, an increasing current through Tap and a decreasing current through Tan is obtained till Tan is blocked and a current routing via Tbn, Tap and Rn provides said "low" voltage on the output Kn and said "high" voltage on the output Kp, till Vin is further increased and comes in the range around the reference value Vref(b) and an increasing current through Tbp and a decreasing current through Tbn is obtained till Tbn is blocked and a current routing via Tbp, Tcn and Rp provides said "low" voltage on the output Kp and said "high" voltage on the output Kn. When the input signal Vin further increases and comes in the range around the reference voltage Vref(c) an increasing current through Tcp and a decreasing current through Tcn is obtained till Tcn is blocked and a current routing via Tbp, Tcp and Rn provides said "low" voltage on the output Kn and said "high" voltage on the output Kp. As appears from the above, in each current routing always one of the transistors of a transistor pair is fully conducting, while the current in the current routing is determined by the input signal on the basis of the other transistor in the current routing.

Figure 4:
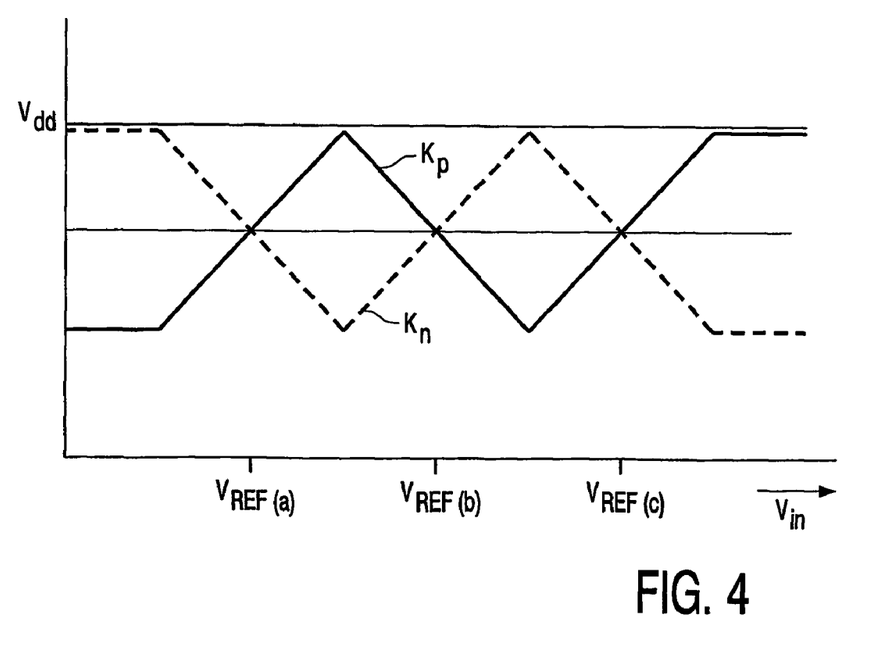
FIG. 4 shows a diagram illustrating the output voltages of the cross-coupled folding circuit of FIG. 3.

The signals at the outputs Kp and Kn are indicated in FIG. 4. Also with this cross-coupled folding circuit a folding factor of 3 is obtained. In this case, the resulting output voltages of the folding cell have a common value of Vdd–$\frac{1}{2}I_{tail} \cdot R_{load}$ and again a voltage swing of $I_{tail} \cdot R_{load}$. However, in comparison with a single transistor pair and contrary to the parallel folding circuit, the value of $R_{load}$ remains unaltered by folding, because there is continually only one current routing. Only a small part of the available power supply voltage is spent on the voltage drop over the fully conducting transistor in the current routing in excess of the power spent on a single pair of transistors. This means that folding practically does not spend power.

Figure 5:
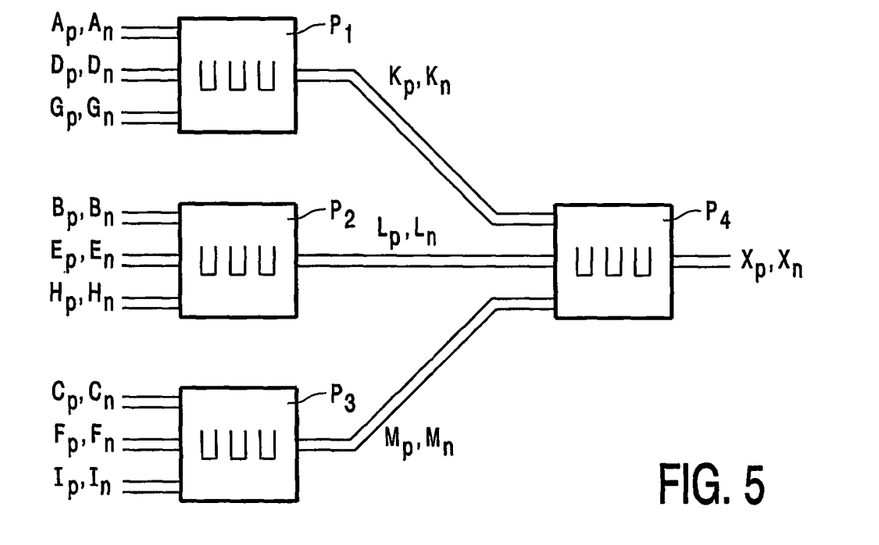
FIG. 5 shows a concatenation of parallel folding circuits according to the state of the art.
Figure 6A:
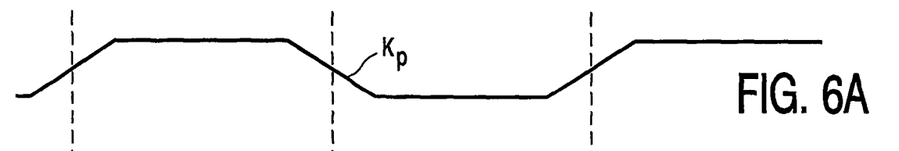
FIG. 6A-6D show diagrams illustrating the higher folding factor of a concatenation of parallel folding circuits of FIG. 5.
Figure 6B:
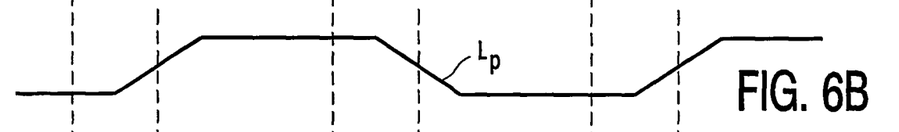
Figure 6C:
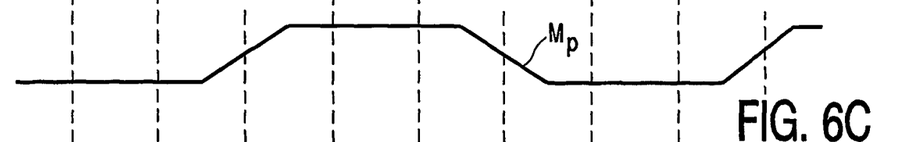
Figure 6D:
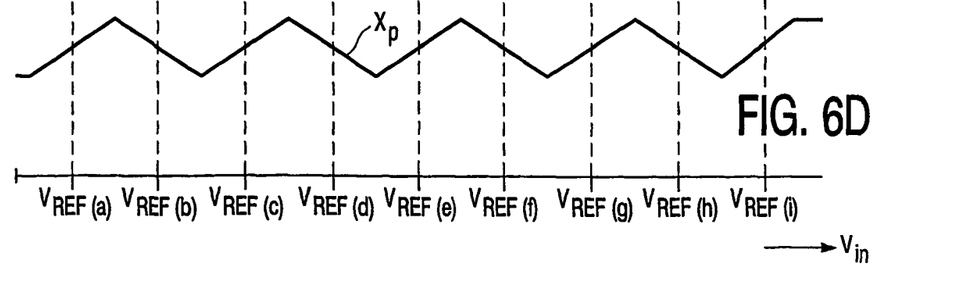

In a flash analog-to-digital converter or in an analog-to-digital converter where part of the conversion is realized by flash conversion, a considerable number of comparators are needed; applying the above folding circuits can reduce this number. In order to further increase the folding factor a concatenation of folding circuits is desired. The situation in which three parallel folding circuits P1, P2 and P3 are arranged in a cascade configuration with a fourth parallel folding circuit P4 is shown in FIG. 5. Folding circuit P1 has input signals Ap, An; Dp, Dn; and Gp, Gn, and provides signals Kp, Kn. Folding circuit P2 has input signals Bp, Bn; Ep, En; en Hp, Hn and provides output signals Lp, Ln. Folding circuit P3 has input signals Cp, Cn; Fp, Fn; en Ip, In and provides output signals Mp, Mn. The output signals of the folding circuits P1, P2 and P3 form the input signals of folding circuit P4. The output signals of folding circuit P4 are Xp, Xn. FIGS. 6A, 6B and 6C show the output signals of the folding circuits P1, P2 and P3, while the output signal of folding circuit P4 is shown in FIG. 6D. This cascade configuration of parallel folding circuits results in a folding factor 9.

In the same way as described before with reference to FIGS. 1 and 3, the input signals Ap, An; Bp, Bn; . . . , Hp, Hn; Ip, In are composed of an input signal Vin and reference signals Vref(a), Vref(b), . . . Vref(h), Vref(i) with 0< Vref(a)<Vref(b)< . . . <Vref(h)<Vref(i). In FIGS. 1 and 3 it is supposed that the amplification in the folding circuits is linear and that the ranges around the reference voltages are exactly in succession to each other. However, in practice the amplification is not linear, while there will be some overlap in the successive ranges. Therefore, the parallel folding circuits P1, P2 and P3 are successively active in the sense that, when input signal Vin increases and comes in the range around Vref(a) circuit P1 will be active, when, thereafter, Vin comes in the range around Vref(b), circuits P2 will be active, when Vin comes in the range around Vref(c), circuit P3 will be active, when Vin comes in the range around Vref(d), circuit P1 will be active again, and so on.

Figure 7:
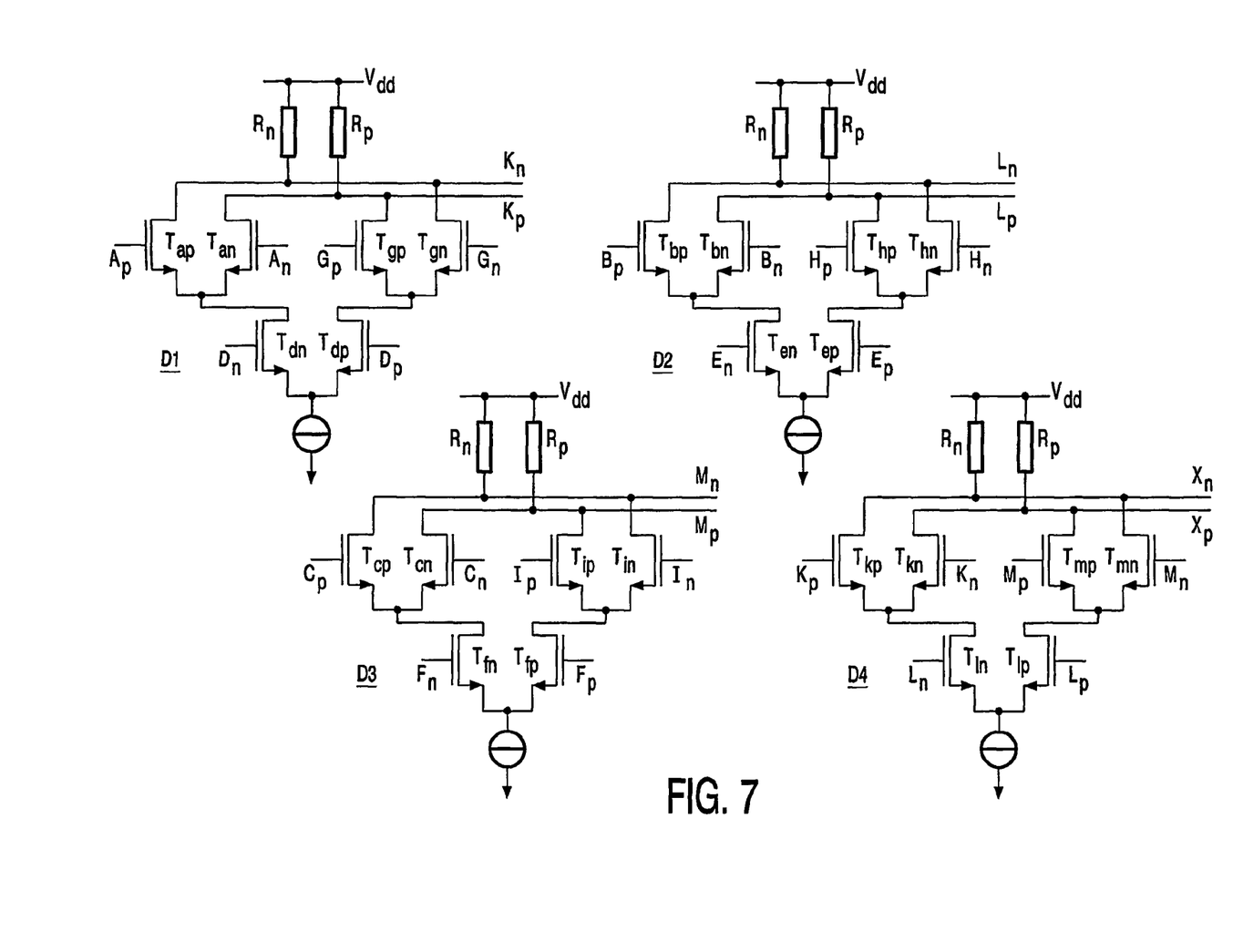
FIG. 7 shows a concatenation of cross-coupled folding circuits according to the state of the art.

When a such like cascade configuration is composed of three cross coupled folding circuits D1, D2 and D3 together with a fourth cross coupled folding circuit D4, as illustrated in FIG. 7 problems will arise.

Figure 8:
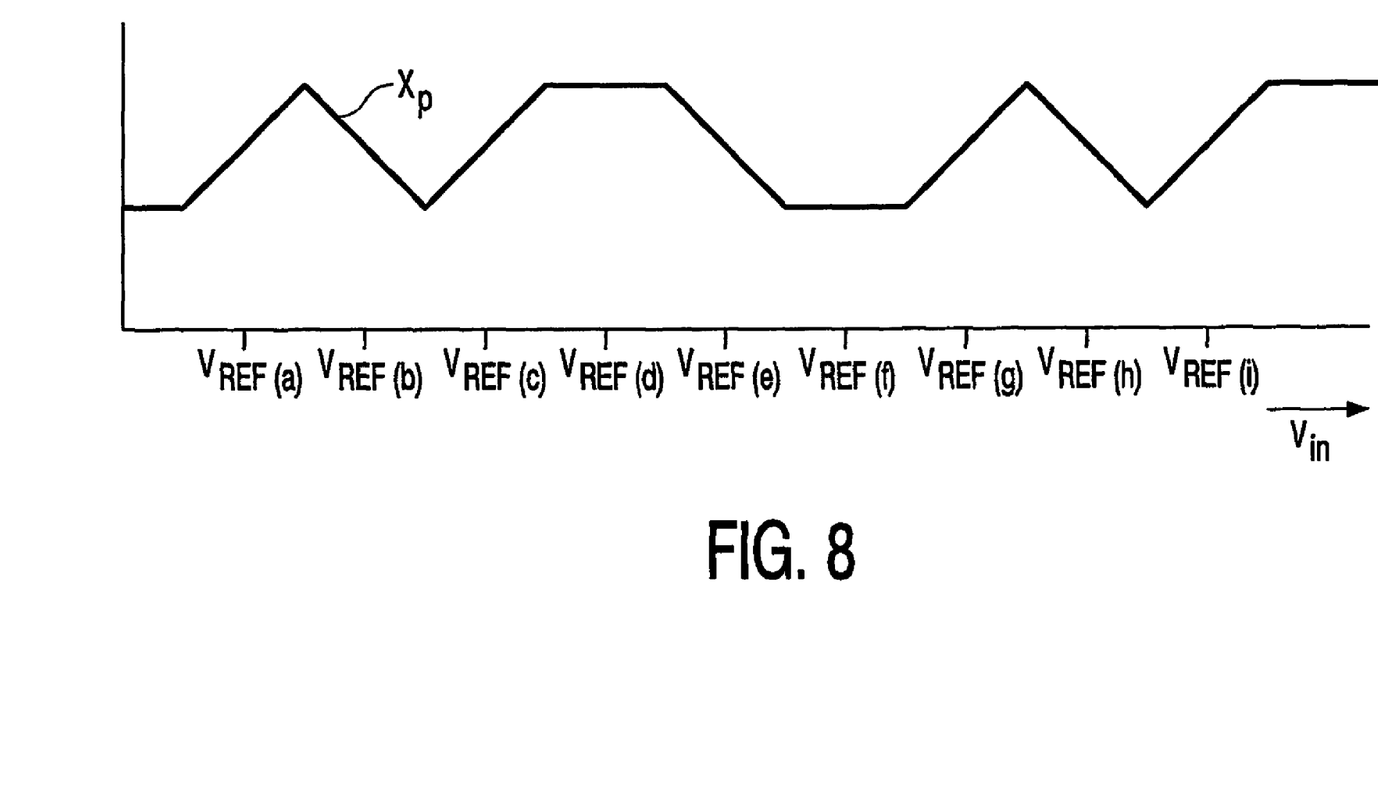
FIG. 8 shows a diagram illustrating the disadvantage of the concatenation of cross-coupled folding circuits of FIG. 7.

When an increasing input signal Vin comes in the range around reference voltage Vref(c), in folding circuit D1 a current routing via Tdn, Tap and Rn is provided, so that at the end of the range Kn will be "low" and Kp will be "high", while as a consequence of a current routing in folding circuit D2 via Ten, Tbp and Rn, Ln will be "low" and Lp will be "high", and of a current routing in folding circuit D3 via Tfn, Tcp and Rn, Mn will be "low" and Mp will be "high". In that case, in folding circuit D4 a current routing via Tlp, Tmp and Rn will be provided and Xn will be "low" and Xp will be "high". When thereafter the input signal comes in the range around reference voltage Vref(d), in folding circuit D1 a current routing via Tdp, Tgn and Rp will be provided, so that at the end of the range Kn will be "high" and Kp will be "low"; the current routing in folding circuits D2 and D3 remains unaltered. Nevertheless in folding circuit D4 a current routing via Tlp, Tmp and Rn will be maintained; the change of Kn and Kp has no effect on the current routing in folding circuit D4. In the range around Vref(d) the output voltages on Xn and Xp remain unaltered. The same situation occurs in the range around Vref(f). The output voltage Xp as a function of the input signal Vin is indicated in FIG. 8. The concatenation of cross coupled folding circuits D1-D4 results in a folding with factor of 6, while in the ranges around Vref(d) and Vref(f) no folding is obtained.

When the concatenation of folding circuits D1-D4 is applied in an analog-to-digital converter, specific measures have to be taken to realize a conversion for voltages in the ranges around Vref(d) and Vref(f). According to the invention this can be realized by measures that provide a folding also in said ranges around Vref(d) and Vref(f). In a first embodiment this is realized by changing the outputs Kp, Kn for the corresponding outputs Mp, Mn in the ranges around Vref(d), Vref(e) and Vref(f) as indicated schematically in FIG. 9, while in a second embodiment this is realized by changing the outputs Lp and Ln relatively to each other in the ranges around Vref(d), Vref(e), Vref(f) as indicated schematically in FIG. 10. In these embodiments a folding with a factor of 9 is obtained. Although such a folding factor can also be realized by a concatenation of four parallel folding circuits as indicated in FIG. 5, the disadvantages of parallel folding circuits are avoided.

Figure 10:
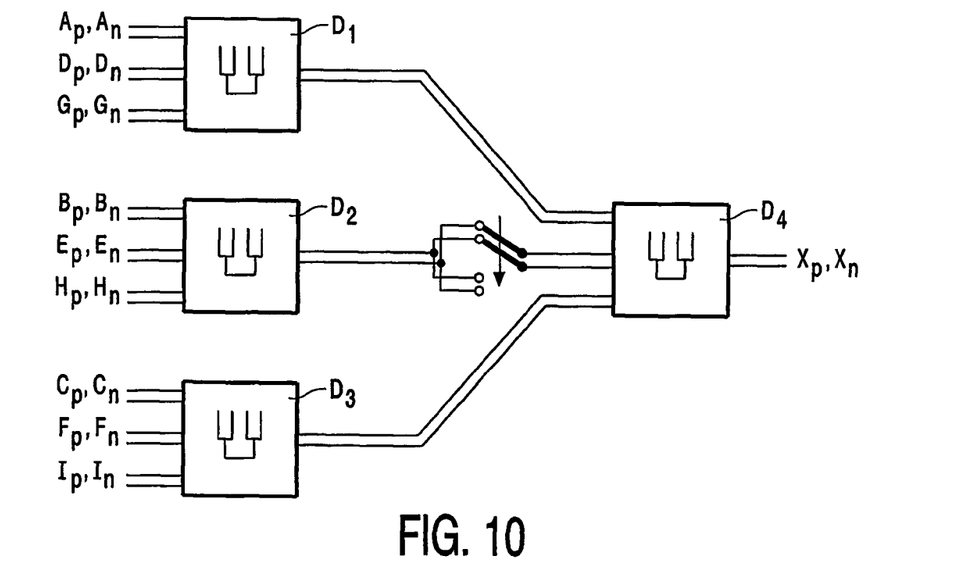
FIG. 10 shows schematically a second embodiment of a concatenation of cross-coupled folding circuits according to the invention.
Figure 11:
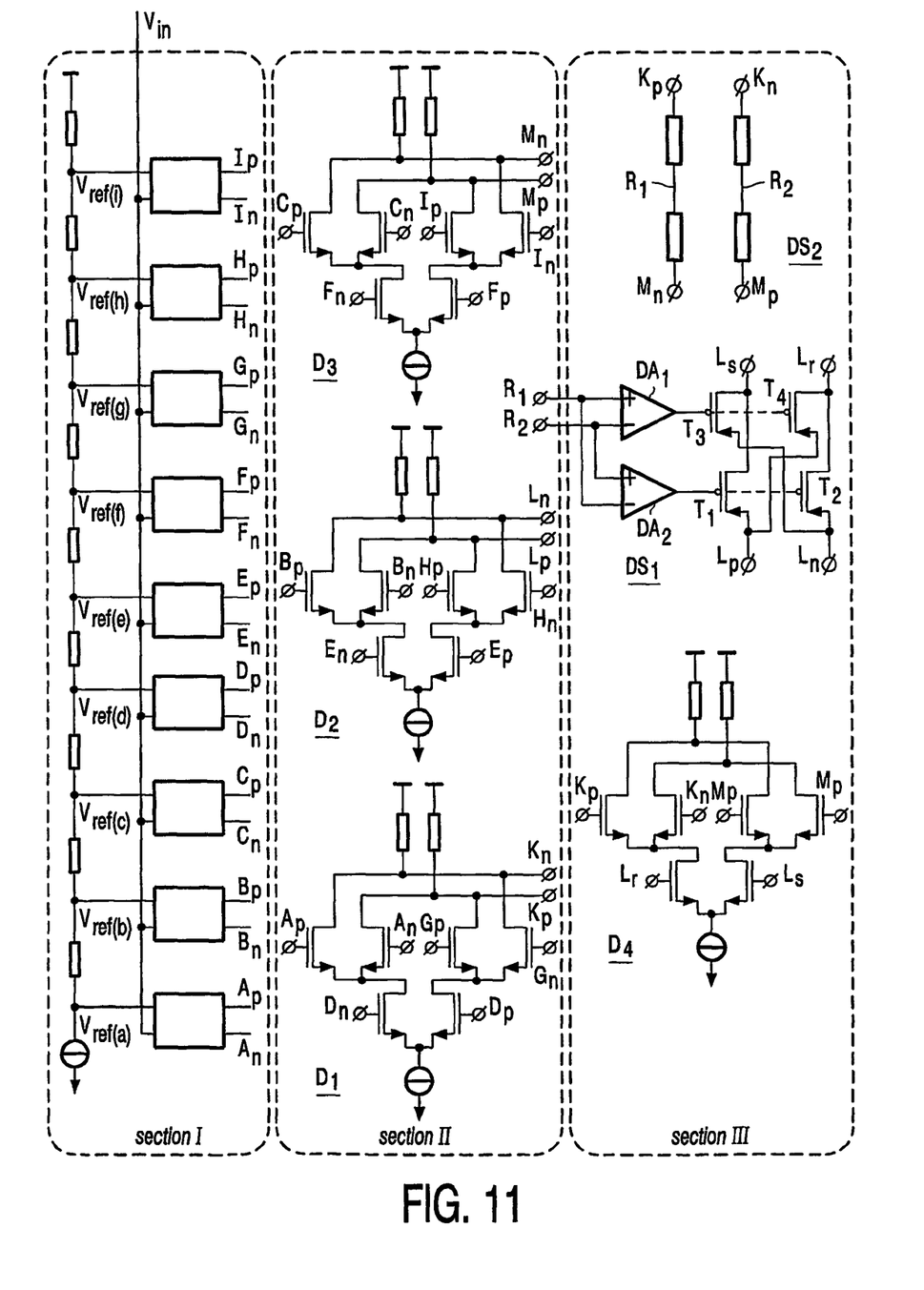
FIG. 11 shows in more detail a three times three cross-coupled folding circuit with preceding amplifier array according to the invention.

FIG. 11 shows a concatenation of four cross-coupled folding circuits in more detail. This embodiment is constituted by three sections: section I, comprising a reference voltage circuit, formed by a resistive array, to provide for a series of reference voltages Vref(a), Vref(b), . . . , ref(i), and an amplifier circuit to derive from the input signal Vin and said reference voltages the base input signals Ap, An; Bp, Bn; . . . ; Ip, In for the transistors in section II; section II, comprising three cross coupled folding circuits D1-D3; and section III, comprising cross coupled folding circuit D4 and circuits for changing the outputs Lp and Ln relative to each other in the ranges around Vref(d), Vref(e) and Vref(f) according to the second embodiment of FIG. 10.

In the ranges around Vref(d), Vref(e) and Vref(f), Ln must be replaced by an inverted signal Ls, and Lp by an inverted signal Lr. In the other ranges Ln=Lr and Lp=Ls. Therefore, in section III a circuit DS1 is provided constituted by transistors T1, T2, T3 and T4. These transistors are controlled in such a way that during said ranges Vref(d), Vref(e) and Vref(f) T1 and T2 are blocked and 13 and T4 are conducting, while in the other ranges T1 and T2 are conducting and T3 and T4 are blocked. The control signals for these switches are derived in circuit DS2 by resistive interpolation between the voltages on the outputs Kp, Mn and Kn, Mp. So, the voltages R1 and R2 are obtained by interpolation between the voltages on Kp and Mn, and on Kn and Mp respectively. For example R1 can be chosen midway between Kp and Mn and R2 midway between Kn and Mp. The exact value of the interpolated signals is not important as only the positions of the crossings of R1 and R2 are relevant. From R1 and R difference values R1−R2 and R2−R1 are obtained by means of amplifiers DA1 and DA2 respectively. In the ranges around Vref(d), Vref(e) and Vref(f) R2>R1, so that Ln and Lp are replaced by their inverted values, while in the other ranges R1>R2 and Ln and Lp are applied to bases of the respective transistors in D4.

Figure 12:
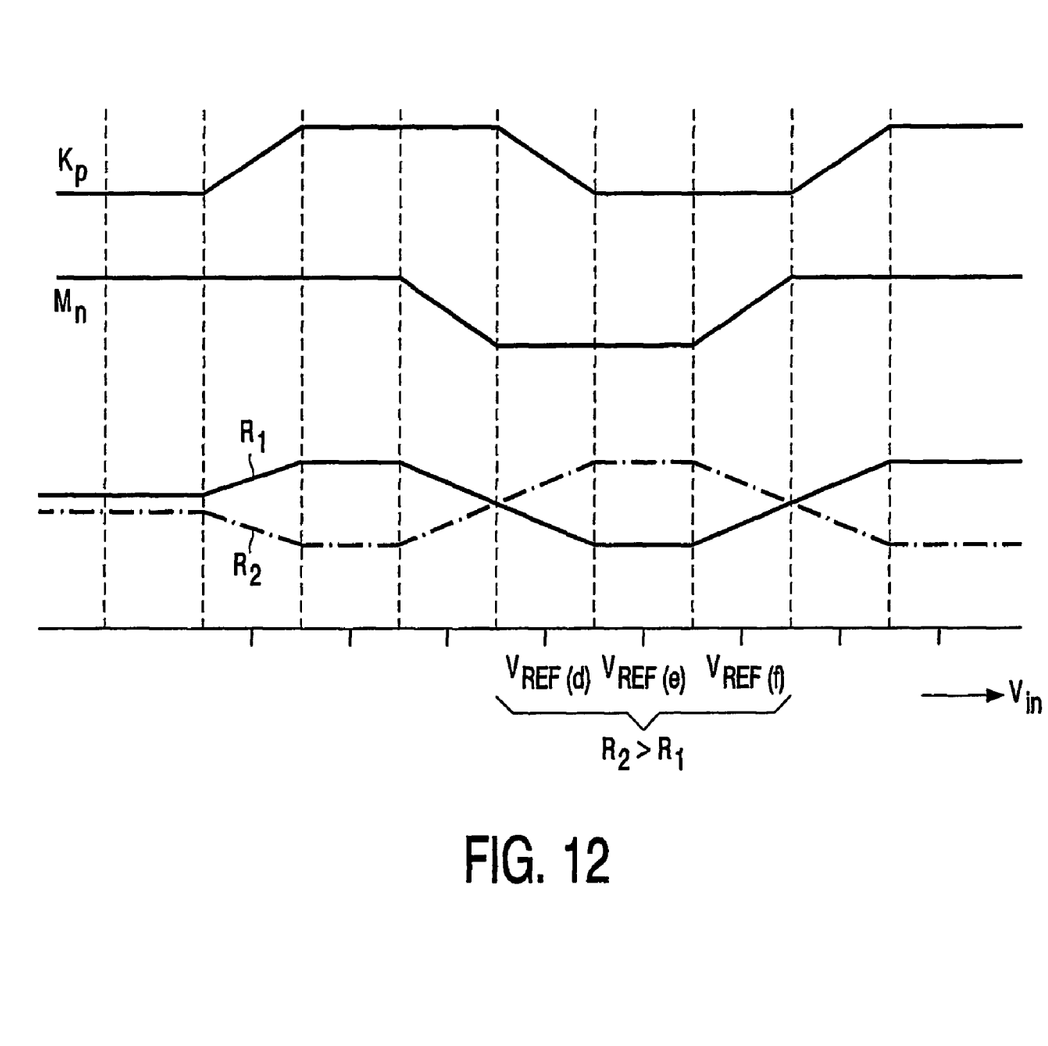
FIG. 12 shows a diagram to illustrate the operation of details in the circuit of FIG. 11.

FIG. 12 shows Kp, Mn, R1 and R2 as a function of Vin. From these functions it will be clear that only in the range around Vref(d), Vref(e) and Vref(f) R2>R1 and that in the other ranges R2≦R1.

Figure 13:
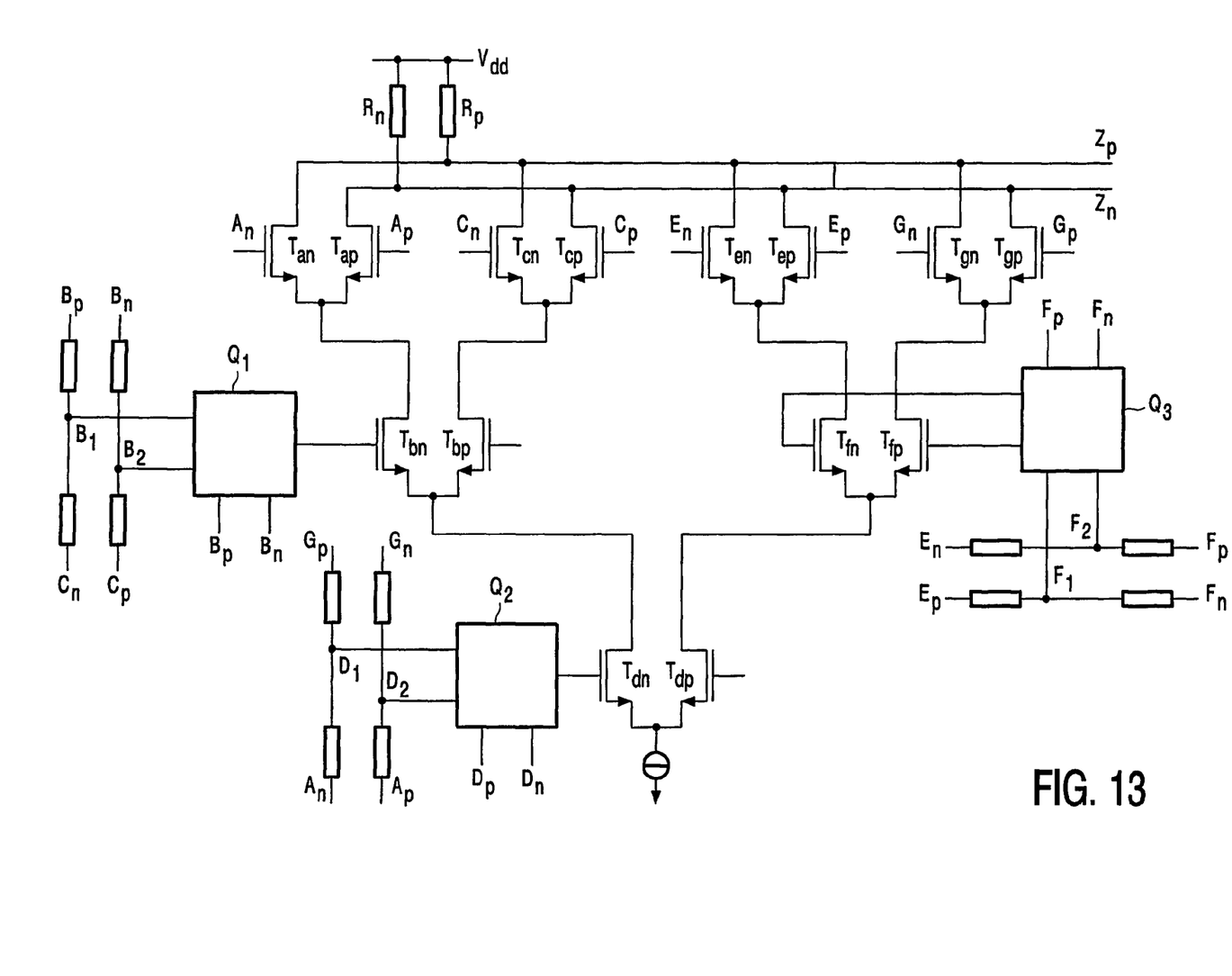
FIG. 13 shows in more detail a seven times cross-coupled folding circuit.

FIG. 13 shows in more detail a seven times cross-coupled folding circuit. When Vin=0, a current routing via Tdn, Tbn, Tan and Rp is provided, so that the output on Zp is "low" and on Zn is "high". When Vin increases and comes in the range around Vref(a), an increasing current through Tap and a decreasing current through Tan is obtained till Tan is blocked and a current routing via Tdn, Tbn, Tap and Rn provides for a voltage "high" on Zp and a voltage "low" on Zn. When Vin further increases and comes in the range around Vref(b), an increasing current through Tbp and a decreasing current through Tbn is obtained till Tbn is blocked and a current routing via Tdn, Tbp, Tcn and Rp provides said "low" voltage on Zp and said "high" voltage on Zn. When Vin further increases and comes in the range around Vref(c), an increasing current through Tcp and a decreasing current through Tcn is obtained till Tcn is blocked and a current routing via Tdn, Tbp, Tcp and Rn provides said "high" voltage on Zp and said "low" voltage on Zn. When Vin further increases and comes in the range around Vref(d), an increasing current through Tdp and a decreasing current through Tdn is obtained till Tdn is blocked and a current routing via Tdp, Tfn, Ten and Rp provides said "low" voltage on Zp and said "high" voltage on Zn. When Vin further increases and comes in the range around Vref(e), an increasing current through Tep and a decreasing current through Ten is obtained till Ten is blocked and a current routing via Tdp, Tfn, Tep and Rn provides said "high" voltage on Zp and said "low" voltage on Zn. When Vin further increases and comes in the range around Vref(f), an increasing current through Tfp and a decreasing current through Tfn is obtained till Tfn is blocked and a current routing via Tdp, Tfp, Tgn and Rp provides said "low" voltage on Zp and said "high" voltage on Zn.

When Vin further increases and comes in the range around Vref(g), an increasing current through Tgp and a decreasing current through Tgn is obtained till Tgn is blocked and a current routing via Tdp, Tfp, Tgp and Rn provides said "high" voltage on Zp and said "low" voltage on Zn. When Vin further increases and comes in the range around Vref(h), an increasing current through Tgp and a decreasing current through Tgn is obtained till Tgn is blocked and a current routing via Tdp, Tfp, Tgp and Rn provides said "high" voltage on Zp and said "low" voltage on Zn. In this case a 7-times folding is obtained without applying the measures according to the invention.

Figure 14:
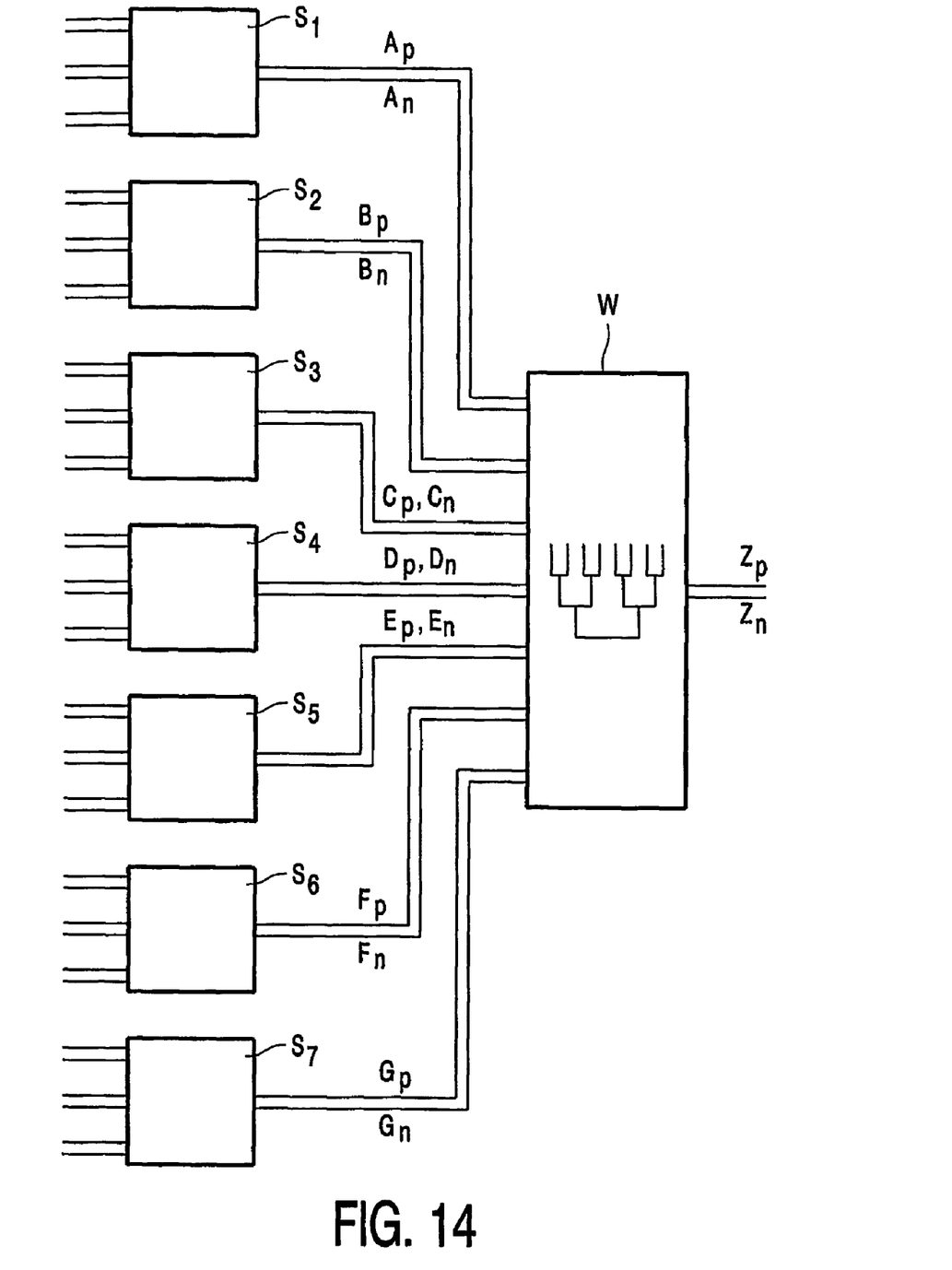
FIG. 14 shows schematically a three times seven cross-coupled folding circuit, constituted by 7 three times cross-coupled folding circuits and the seven times cross-coupled folding circuit of FIG. 13 with application of the measures according to the invention.

This seven times cross-coupled folding circuit can be extended to a three times seven cross coupled folding circuit by combining this circuit with seven three times cross-coupled folding circuits, as shown in FIG. 3 and in section II of FIG. 11, and by applying the measures according to the invention. Such a configuration is shown in FIG. 14. In this embodiment the configuration of FIG. 13 forms an alternative embodiment of section III in FIG. 11, while section II in that case comprises 7 three times cross-coupled folding circuits.

In order to describe the latter embodiment with reference to FIG. 13 and to show that the circuit of FIG. 13 forms section III in the embodiment of FIG. 11, the outputs of the 7 three times folding circuits S1, S2, . . . , S7 are represented by Ap, An; Bp, Bn; ..., Gp, Gn, as indicated in FIG. 14. As each three times folding circuit covers three input signal ranges, e.g. ranges 1, 7, 14; 2, 8, 15; 3, 9, 16, etc. (numbered in the same way as in FIGS. 7 and 11), the values of Ap, Bp, ..., Gp are successive and as indicated in the next table. In said table a rising voltage in a respective range is indicated by R, a falling voltage in a respective range by F, while a constantly high voltage level in a respective range is indicated by H and a constantly low voltage level in a respective range by L. The outputs of the three times folding circuits S1, S2, ..., S7 are supplied to a circuit W. This circuit W is identical to the circuit in FIG. 13; the outputs thereof are Zp and Zn.

|  | Ap | Bp | Cp | Dp | Ep | Fp | Gp | Zp* | Zp |
|---|---|---|---|---|---|---|---|---|---|
| Below range around Vref(1) | L | L | L | L | L | L | L | L | L |
| Range around Vref(1) | R | L | L | L | L | L | L | R | R |
| Range around Vref(2) | H | R | L | L | L | L | L | F | F |
| Range around Vref(3) | H | H | R | L | L | L | L | R | R |
| Range around Vref(4) | H | H | H | R | L | L | L | F | F |
| Range around Vref(5) | H | H | H | H | R | L | L | R | R |
| Range around Vref(6) | H | H | H | H | H | R | L | F | F |
| Range around Vref(7) | H | H | H | H | H | H | R | R | R |
| Range around Vref(8) | F | H(L) | H | H(L) | H | H | H | H | F |
| Range around Vref(9) | L | F(R) | H | H(L) | H | H | H | H | R |
| Range around Vref(10) | L | L | L | H(L) | H | H | H | H | F |
| Range around Vref(11) | L | L | L | F(R) | H | H | H | F | R |
| Range around Vref(12) | L | L | L | L(H) | L | H(L) | H | L | F |
| Range around Vref(13) | L | L | L | L(H) | L | F(R) | H | L | R |
| Range around Vref(14) | L | L | L | L(H) | L | L | F | L | F |
| Range around Vref(15) | R | L | L | L | L | L | L | R | R |
| Range around Vref(16) | H | R | L | L | L | L | L | F | F |
| Range around Vref(17) | H | H | R | L | L | L | L | R | R |
| Range around Vref(18) | H | H | H | R | L | L | L | F | F |
| Range around Vref(19) | H | H | H | H | R | L | L | R | R |
| Range around Vref(20) | H | H | H | H | H | R | L | F | F |
| Range around Vref(21) | H | H | H | H | H | H | R | R | R |
| Above range around Vref(21) | H | H | H | H | H | H | H | H | H |

Figure 15:
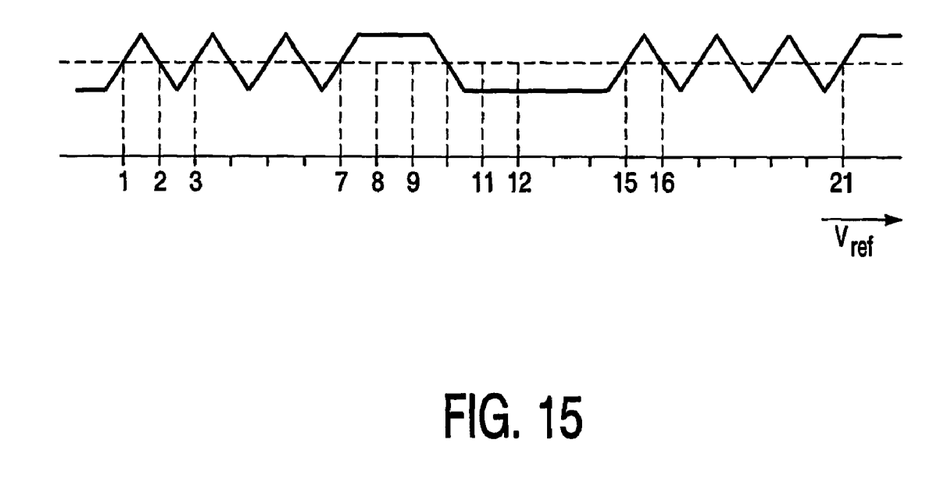
FIG. 15 shows a diagram illustrating the output of the circuit of FIG. 14 when the measures according to the invention are not applied.

Without the measures according to the invention the voltage on the p-output, indicated by Zp*, will be as indicated in the table and as shown in FIG. 15. In six ranges, viz. around the reference voltages Vref(8), Vref(9), Vref(10) and Vref(12), Vref(13) and Vref(14) no folding occurs. The Zp* output signal can be represented by the succession L-R-F-R-F-R-F-R-H-H-H-F-L-L-L-R-F-R-F-R-F-R-H.

Figure 9:
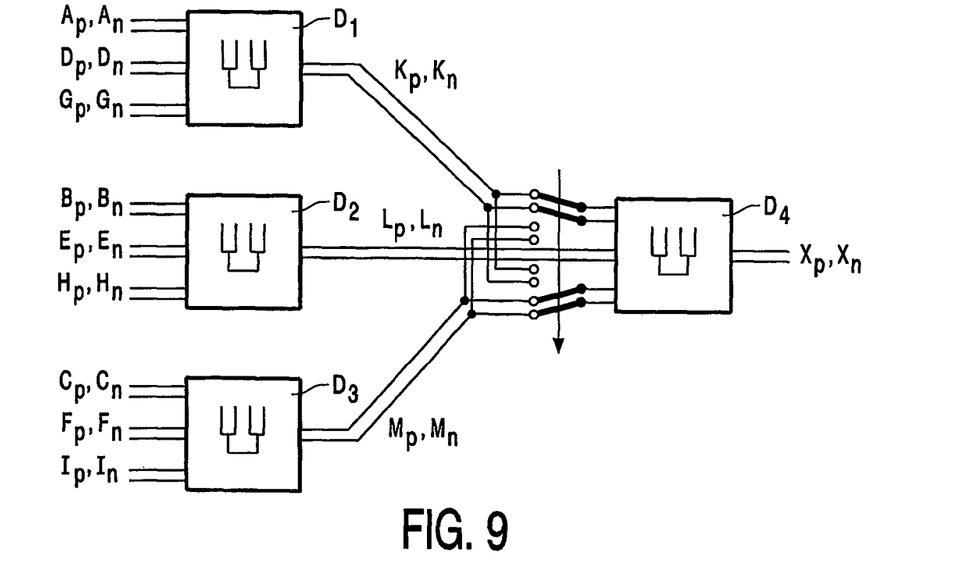
FIG. 9 shows schematically a first embodiment of a concatenation of cross-coupled folding circuits according to the invention.

Complete folding can be obtained by inverting the values of Bp and Bn during the ranges Vref(8) and Vref(9), by inverting the values of Dp and Dn during the ranges Vref(8), Vref(9), Vref(10), Vref(11), Vref(12), Vref(13) and Vref(14) and by inverting the values of Fp and Fn during the ranges Vref(12) and Vref(13). The Zp output signal can be represented by the succession L-R-F-R-F-R-F-R-F-R-F-R-F-R-F-R-F-R-F-R-F-R-H, i.e. a correct series of successively rising and falling voltages. By such a processing complete folding by a folding factor of 21 is obtained. In the table the inverted voltage levels are indicated between brackets. The described measures to obtain complete folding represent the most compact solution. However, other methods, in analogy with the examples indicated in FIGS. 9 and 10, are still possible.

The inverting operation is performed by means of circuits Q1, Q2 and Q3; these circuits have the same structure as the respective circuit DS1 in section III of FIG. 11. Each of them comprises four transistors controlled by signals B1, B2; D1, D2; and F1, F2 derived from voltages obtained by resistive interpolation between Bp and Cn, and Bn and Cp; between Gp and An, and Gn and Ap; and between Ep and Fn, and En and Fp, respectively.

In the ranges around Vref(8) and Vref(9) B2>B1, while in the other ranges B1>B2. When B1>B2, the bases of the transistors Tbn and Tbp are controlled by the signals Bn and Bp respectively, while, when B2>B1 these transistors are controlled by Bp and Bn respectively. In the ranges around Vref(8), Vref(9), Vref(10), Vref(11), Vref(12), Vref(13) and Vref(14) D2>D1, while in the other ranges D1>D2. In the ranges around Vref(12) and Vref(13) F2>F1, while in the other ranges F1>F2. The same inversion of the control signals for the respective transistors Tdn and Tdp, and Tfn and Tfp respectively as described for the transistors Tbn and Tbp is obtained.

Summarizing it can be ascertained that in the embodiment of FIG. 11 three times folding circuits are applied (section II) and in cascade therewith two differential transistor pairs and further in cascade therewith one differential transistor pair (section III), while one inverting circuit is provided, cooperating with the last step in the cascade configuration. In the embodiment of FIG. 14, seven three times folding circuits (section II) are applied and in cascade therewith four, two and one differential transistor pair, respectively (section II), while three inverting circuits are provided cooperating with the last two steps in the cascade configuration.

In general, section II comprises $2^n-1$ three times folding circuits, and in section III there are differential transistor pairs in a cascade configuration $2^{n-1}, 2^{n-2}, \ldots, 2^0$ respectively, while inverting circuits are provided, cooperating with the last $2^{n-2}$ steps in the cascade configuration. In that case $m=3(2^n-1)$ reference voltages are sufficient. In the embodiment of FIG. 11, n=2; in the embodiment of FIG. 13, n=3. When, for example n=4, in section II there will be 15 three times folding circuits, and in section III a cascade configuration of 8, 4, 2 and 1 differential transistor pairs; in the last 3 steps inverting circuits are necessary to obtain complete folding.

Figure 16:
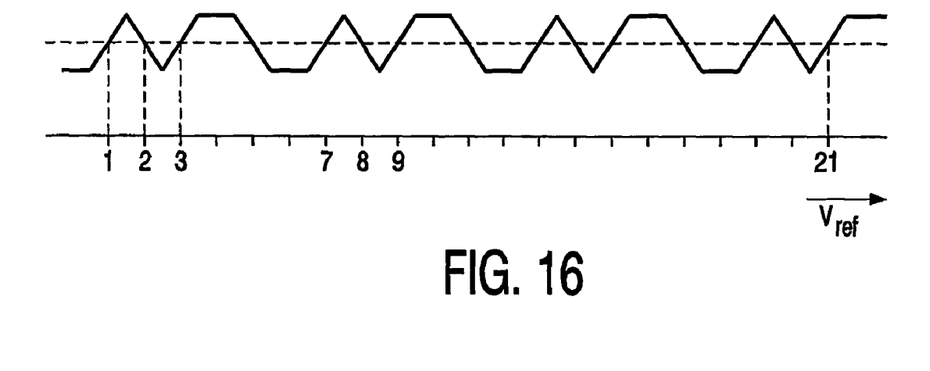
FIG. 16 shows a diagram illustrating the output of the circuit of FIG. 14 with an alternative distribution of ranges of reference voltages over the seven three times folding circuits in FIG. 14.

The embodiments described herein are intended to be taken in an illustrative and not limiting sense. Various modifications may be made to these embodiments by persons skilled in the art without departing from the scope of the present invention as defined in the appended claims. The number of three times cross coupled folding circuits can be different from 3 or 7 as in the embodiments described. Also the number and the structure of the cross coupled folding circuits can be different from those in section III of FIG. 11 and in block W in FIG. 14, i.e. the circuit in FIG. 13. Also the sequence in which the three times folding circuits cover three input signal ranges can be different from the described sequence of ranges 1, 7, 14; 2, 8, 15; 3, 9, 16, etc., for example, in a less preferred embodiment, 1, 2, 3; 4, 5, 6; 7, 8, 9, etc. In that case the output signal Zp* without the measures according to the invention will be as indicated in FIG. 16, while the inverting operation to obtain complete folding is more complicated. Of course in the same number of ranges around reference voltages as in FIG. 15 there is no folding.

The folding circuit according to the invention can be applied in analog-to-digital converters, for example in flash converters to reduce the number of comparators therein, or in converters comprising coarse and a fine resolution conversion. Then it may be possible to realize coarse conversion by a flash converter or a successive approximation converter and a fine conversion after folding according to the present invention; this fine conversion can again be realized by flash conversion or successive approximation conversion. Nevertheless, the combination of flash and successive approximation converters will not be applied very often in practice; flash conversion is applied when a high conversion rate is required, whereas successive approximation conversion needs more time because of its feedback structure.

The invention claimed is:

1. Cross coupled folding circuit, comprising a reference voltage circuit to supply a series of m reference voltages (Vref(k) with k=1, 2, ..., m), an amplifier circuit to provide a series of control signals (Vin −Vref(k) and −Vin+Vref(k)) in response to an input signal (Vin) and to the reference voltages (Vref(k)), and a number of differential transistor pairs in a cascade configuration controlled by said control signals, each differential pair of transistors being active in a voltage range around one of said reference voltages, characterized in that $2^n-1$ three times cross coupled folding circuits are provided, each of which comprising three differential pairs of transistors, and, in a cascade configuration with said $2^n-1$ folding circuits, in n−1 successive steps $2^{n-1}$, $2^{n-2}$, ..., $2^0$ differential transistor pairs, the control signals thereof being supplied by the series of three times cross coupled folding circuits, and $m=3(2^n-1)$, while, to obtain complete folding, switching circuits cooperating with the transistor pairs in the last $2^{n-2}$ steps of the cascade configuration are provided, to supply the respective control signals to those transistors of the respective differential transistor pairs which provide complete folding.

2. Cross coupled folding circuit according to claim 1, characterized in that the cross coupled folding circuit is constituted by three successively active three times cross coupled folding circuits (D1, D2, D3) and, in cascade therewith, a further three times cross coupled folding circuit (D4) and a switching circuit is provided to interchange the control signals for the further three times folding circuit (D4) supplied by the first (D1) and the last (D3) active three times folding circuit (n=2, FIG. 9).

3. Cross coupled folding circuit according to claim 1, characterized in that the cross coupled folding circuit is constituted by 3 three successively active three times cross coupled folding circuits (D1, D2, D3) and, in cascade therewith, a further three times cross coupled folding circuit (D4) and a switching circuit is provided to invert the control signals for the further three times folding circuit (D4), supplied by the middle (D2) active three times folding circuit (n=2, FIGS. 10 and 11).

4. Cross coupled folding circuit according to claim 1, characterized in that the cross coupled folding circuit is constituted by seven successively active three times cross coupled folding circuits (S1-S7) and, in cascade therewith, a seven times cross coupled folding circuit (W) comprising in three successive steps 4, 2 and 1 differential transistor pairs, and 3 switching circuits (Q1-Q3) are provided to invert the control signals for the differential transistor pairs in the last two steps, supplied by three of the seven active three times folding circuits (n=3, FIG. 14 with 13).

5. Cross coupled folding circuit according to claim 3, characterized in that a switching circuit is provided with switching transistors to pass either the control signals to the basis of the first and second transistor of the differential transistor pair respectively or to the basis of the second and first transistor of said differential transistor pair respectively.

6. Cross coupled folding circuit according to claim 5, characterized in that the switching transistors are controlled by difference signals derived from voltages obtained by resistive interpolation between output signals of two of the $2^n-1$ successively active three times cross coupled folding circuits.

7. Analog-to-digital converter provided with a folding circuit according to claim 1.

* * * * *